United States Patent
Chiang et al.

(10) Patent No.: US 9,875,901 B2
(45) Date of Patent: Jan. 23, 2018

(54) MANUFACTURING METHOD OF METAL OXIDE SEMICONDUCTOR TRANSISTOR

(71) Applicant: UNITED MICROELECTRONICS CORP., Hsin-Chu (TW)

(72) Inventors: Wen-Tai Chiang, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/941,648

(22) Filed: Nov. 15, 2015

(65) Prior Publication Data

US 2016/0079071 A1 Mar. 17, 2016

Related U.S. Application Data

(62) Division of application No. 14/592,872, filed on Jan. 8, 2015, now Pat. No. 9,219,140, which is a division
(Continued)

(51) Int. Cl.
*H01L 29/76* (2006.01)
*H01L 21/285* (2006.01)
(Continued)

(52) U.S. Cl.
CPC .. *H01L 21/28518* (2013.01); *H01L 21/28008* (2013.01); *H01L 21/76804* (2013.01);
(Continued)

(58) Field of Classification Search
CPC ......... H01L 21/28518; H01L 21/76814; H01L 29/517; H01L 29/66545; H01L 29/66636
See application file for complete search history.

(56) References Cited

U.S. PATENT DOCUMENTS 5,352,631 A 10/1994 Sitaram
5,998,873 A 12/1999 Blair
(Continued)

FOREIGN PATENT DOCUMENTS

CN 1787177 A 6/2006
CN 102110612 A 6/2011
(Continued)

*Primary Examiner* — Allen Parker
*Assistant Examiner* — Frederick B Hargrove
(74) *Attorney, Agent, or Firm* — Winston Hsu

(57) ABSTRACT

A manufacturing method of MOS transistor, the MOS transistor includes a substrate, a gate oxide, a gate, a source/drain region and a silicide layer. The gate oxide is disposed on the substrate and the gate is disposed on the gate oxide. The source/drain region is disposed in the substrate at two sides of the gate. The silicide layer is disposed on the source/drain region, wherein the silicide layer includes a curved bottom surface and a curved top surface, both the curved top surface and the curved bottom surface bend toward the substrate and the curved top surface is sunken from two sides thereof, two ends of the silicide layer point tips raised up over the source/drain region and the silicide layer in the middle is thicker than the silicide layer in the peripheral, thereby forming a crescent structure. The present invention further provides a manufacturing method of the MOS transistor.

13 Claims, 5 Drawing Sheets

Related U.S. Application Data of application No. 13/292,086, filed on Nov. 9, 2011, now Pat. No. 8,975,672.

(51) Int. Cl.
    *H01L 29/417*     (2006.01)
    *H01L 29/49*     (2006.01)
    *H01L 29/51*     (2006.01)
    *H01L 29/66*     (2006.01)
    *H01L 21/768*     (2006.01)
    *H01L 21/28*     (2006.01)
    *H01L 29/78*     (2006.01)

(52) U.S. Cl.
    CPC .... *H01L 29/41725* (2013.01); *H01L 29/4958* (2013.01); *H01L 29/4966* (2013.01); *H01L 29/516* (2013.01); *H01L 29/517* (2013.01); *H01L 29/518* (2013.01); *H01L 29/665* (2013.01); *H01L 29/6659* (2013.01); *H01L 29/66545* (2013.01); *H01L 29/78* (2013.01); *H01L 21/76814* (2013.01); *H01L 29/66628* (2013.01); *H01L 29/66636* (2013.01); *H01L 29/785* (2013.01); *H01L 29/7848* (2013.01)

(56) References Cited

U.S. PATENT DOCUMENTS

| | | |
|---|---|---|
| 6,025,617 A | 2/2000 | Sim |
| 6,136,698 A | 10/2000 | Lu |
| 6,214,710 B1 | 4/2001 | Park |
| 6,855,607 B2 | 2/2005 | Achuthan |
| 7,013,446 B2 | 3/2006 | Ohba |
| 7,112,495 B2 | 9/2006 | Ko |
| 7,214,620 B2 | 5/2007 | Kim |
| 7,250,658 B2 | 7/2007 | Doris |
| 7,329,604 B2 | 2/2008 | Kawamura |
| 7,338,867 B2 | 3/2008 | Lee |
| 7,521,324 B2 | 4/2009 | Ohmi |
| 7,531,437 B2 | 5/2009 | Brask |
| 7,550,336 B2 | 6/2009 | Hsiao |
| 7,592,270 B2 | 9/2009 | Teo |
| 7,768,074 B2 | 8/2010 | Golonzka |
| 7,816,261 B2 | 10/2010 | Zhu |
| 8,658,507 B2 | 2/2014 | Zhu et al. |
| 8,975,672 B2 | 3/2015 | Chiang |
| 2003/0148563 A1 | 8/2003 | Nishiyama |
| 2004/0161884 A1 | 8/2004 | Lee |
| 2005/0142779 A1 | 6/2005 | Cheong |
| 2007/0015365 A1 | 1/2007 | Chen |
| 2007/0072376 A1 | 3/2007 | Chen |
| 2007/0218661 A1 | 9/2007 | Shroff |
| 2008/0061366 A1 | 3/2008 | Liu |
| 2008/0128746 A1* | 6/2008 | Wang ................. H01L 29/7848 257/190 |
| 2008/0157208 A1* | 7/2008 | Fischer ............. H01L 21/76843 257/368 |
| 2008/0315267 A1* | 12/2008 | Hampp ........... H01L 21/823807 257/288 |
| 2009/0057759 A1 | 3/2009 | Obradovic |
| 2009/0124097 A1 | 5/2009 | Cheng |
| 2009/0191684 A1 | 7/2009 | Shue |
| 2009/0200494 A1 | 8/2009 | Hatem |
| 2010/0040768 A1 | 2/2010 | Dhindsa |
| 2010/0044783 A1 | 2/2010 | Chuang |
| 2010/0048027 A1 | 2/2010 | Cheng |
| 2010/0129994 A1 | 5/2010 | Awad |
| 2011/0065245 A1* | 3/2011 | Chen ..................... H01L 29/665 438/197 |
| 2012/0032275 A1* | 2/2012 | Haran ............... H01L 21/28518 257/401 |
| 2012/0139015 A1* | 6/2012 | Yu .................... H01L 21/28518 257/288 |
| 2012/0146142 A1* | 6/2012 | Zhu .................. H01L 29/66772 257/347 |
| 2012/0187460 A1* | 7/2012 | Lavoie ................. H01L 29/665 257/288 |
| 2012/0273798 A1* | 11/2012 | Alptekin ............ H01L 29/7833 257/77 |
| 2012/0319203 A1* | 12/2012 | Cheng ............... H01L 29/66666 257/346 |

FOREIGN PATENT DOCUMENTS

| | | |
|---|---|---|
| CN | 102117750 A | 7/2011 |
| JP | 2000286411 A | 10/2000 |

* cited by examiner

MANUFACTURING METHOD OF METAL OXIDE SEMICONDUCTOR TRANSISTOR

CROSS REFERENCE TO RELATED APPLICATIONS

This application is a Divisional of application Ser. No. 14/592,872 filed Jan. 8, 2015 which is a Divisional of application Ser. No. 13/292,086 filed Nov. 9, 2011, and included herein by reference.

BACKGROUND OF THE INVENTION

1. Field of the Invention

The present invention relates to a manufacturing method of metal oxide semiconductor (MOS) transistor, and more particularly, to a manufacturing method of MOS transistor having a silicide layer with a curved bottom surface.

2. Description of the Prior Art

With a trend towards scaling down the size of the semiconductor devices, conventional methods are used to achieve optimization and reduce the thickness of the gate dielectric layer, like reducing the thickness of silicon dioxide layer, but have faced problems such as current leakage due to the tunneling effect. In order to keep progressing towards the next technology generation, high-k materials are used to replace the conventional silicon oxide in the gate dielectric layers, because it decreases the thickness physical limits effectively, reduces current leakage, and achieves equivalent capacitance with an equivalent oxide thickness (EOT).

On the other hand, the conventional poly-silicon gates also face problems, such as lower performance due to boron penetration, and an unavoidable depletion effect, which increases equivalent thickness of the gate dielectric layer, reduces gate capacitance, and decreases the driving force of the device. Thus, work function metals that are compatible with the high-k gate dielectric layers are developed to replace the conventional poly-silicon gates as control electrodes.

According to the fabricating sequence of the high-k dielectrics, a conventional method of forming a MOS transistor can be divided into "high-k first" processes and "high-k last" processes. In the "high-k last" processes, after forming the high-k dielectric layer, an annealing step is usually performed to improve the quality of the high-k dielectric layer. However, this annealing step may be harmful to other already-formed semiconductor components, such as silicide layer, thus influencing the quality of the MOS transistor.

SUMMARY OF THE INVENTION

The present invention therefore provides a manufacturing method of MOS transistor to resolve the above-mentioned problem.

According to one embodiment of the present invention, a MOS transistor is provided. The MOS transistor includes a substrate, a gate oxide, a gate, a source/drain region and a silicide layer. The gate oxide is disposed on the substrate and the gate is disposed on the gate oxide. The source/drain region is disposed in the substrate on both sides of the gate. The silicide layer is disposed on the source/drain region, wherein the silicide layer includes a curved bottom surface and a curved top surface, both the curved top surface and the curved bottom surface bend toward the substrate and the curved top surface is sunken from two sides thereof, two ends of the silicide layer point tips raised up over the source/drain region and the silicide layer in the middle is thicker than the silicide layer in the peripheral, thereby forming a crescent structure.

According to another embodiment of the present invention, a manufacturing method of a MOS transistor is provided. A substrate is provided. A transistor is disposed in the substrate, wherein the transistor includes a gate dielectric layer, a gate on the gate dielectric layer and a source/drain region in the substrate on both sides of the gate. A sacrificial layer is formed on the substrate to cover the transistor. Then, a part of the sacrificial layer is removed to expose the source/drain regions. Finally, a silicide layer is deposited on the exposed source/drain regions.

In the present invention, the silicide layer is formed after the high-k dielectric layer, so that the annealing process of the high-k dielectric does not affect the silicide layer. In addition, the MOS transistor in the present invention is formed in a narrow space, such as a contact hole, so that a structure with a curved bottom surface can be provided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
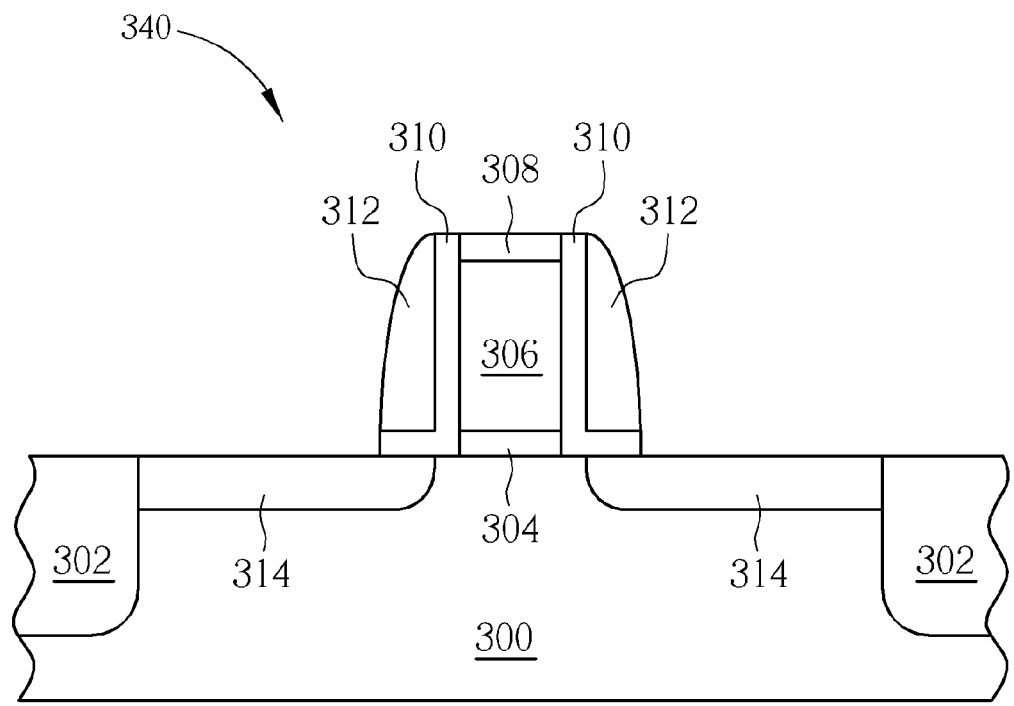
FIG. 1 to FIG. 8 illustrate a method of manufacturing a MOS transistor in accordance with the first embodiment of the present invention.

Please refer to FIG. 1 to FIG. 8. FIG. 1 to FIG. 8 illustrate a method of manufacturing a MOS transistor in accordance with the first embodiment of the present invention. In the present embodiment, the MOS transistor can be a PMOS or an NMOS, with a preferred implementing method comprising a "gate-last" process and a "high-k last" process. As shown in FIG. 1, a substrate 300 is provided; which could be a silicon substrate, a silicon-containing substrate or a silicon-on-insulator (SOI) substrate. A plurality of shallow trench isolations (STI) 302 is formed on the substrate 300 to electrically isolate the MOS transistors 340 in the substrate 300.

As shown in FIG. 1, a MOS transistor 340 is formed in the substrate 300. In one embodiment of the present invention, the MOS transistor 340 includes an interfacial layer 304, a dummy gate 306, a cap layer 308, a liner layer 310, a spacer 312 and a light doped drain (LDD) region 314. In one embodiment, the interfacial layer 304 includes $SiO_2$ or SiN. The dummy gate 306 comprises poly-silicon, which may include undoped poly-silicon, doped poly-silicon, amorphous silicon or a composite material including the combination thereof. In another embodiment, the dummy gate 306 may include tapered sidewalls and has a "top-big-bottom-small" structure. The cap layer 308 includes $SiO_2$, SiC, SiN or SiON. The liner layer 310 includes $SiO_2$. The spacer 312 can be a monolayered structure or a multilayered structure including high temperature oxide (HTO), SiN, $SiO_2$, SiON or SiN formed by hexachlorodisilane ($Si_2Cl_6$) (HCD-SiN). In one embodiment of the present invention, the method of forming the MOS transistor 340 includes the following steps. First, an interfacial layer, a dummy gate layer and a cap layer are formed on the substrate 300, and then the stacked layers are patterned to form a gate structure of the MOS transistor 340. A liner layer 310 is then formed on the sidewall of the gate structure. Subsequently, an LDD region 314 is formed in the substrate 300 next to the dummy gate 306. Lastly, the spacer 312 is formed on the sidewalls of the liner layer 310. The method of forming the MOS transistor 340 is not limited to the above-mentioned steps but can include other methods, which are well known by one skilled in the arts, and are not described in details hereafter.

Figure 2:
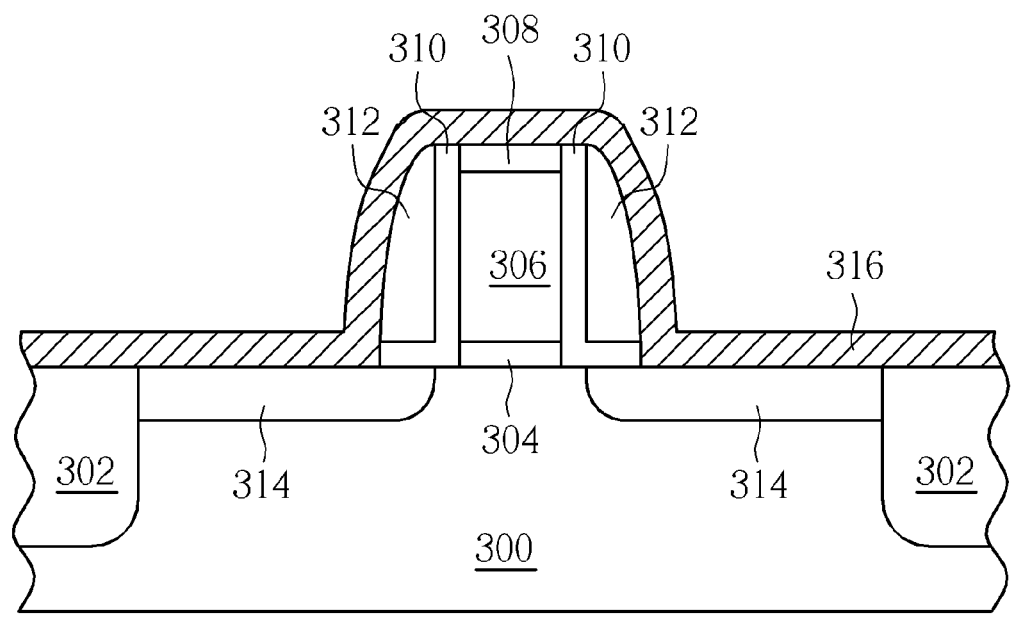

As shown in FIG. 2, a mask layer 316 is formed on the substrate 300. The mask layer 316 covers the MOS transistor 340. In one embodiment, the mask layer 316 includes, for example, SiN or advanced pattern film (APF) provided by Applied Material, Inc. The thickness of the mask layer 316 is comprised between 20 angstrom (Å) and 150 Å, preferably 50 Å.

Figure 3:
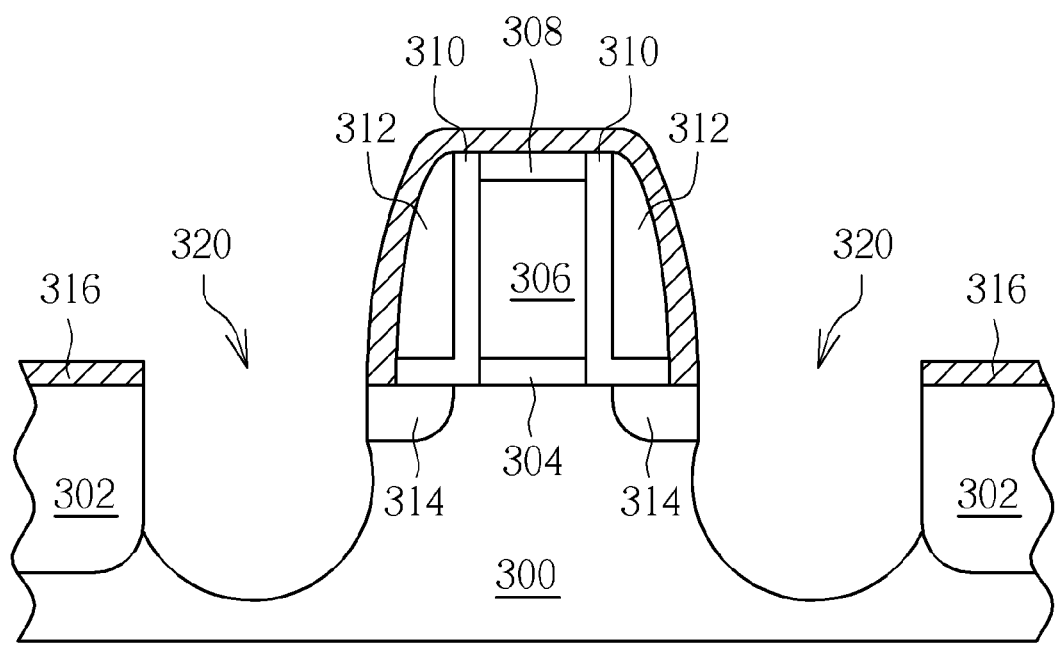

As shown in FIG. 3, an etching process is performed to form at least a second recess 320 in the substrate 300 on both sides of the dummy gate 306 of the MOS transistor 340. For example, a dry etching process can first be performed to form at least one first recess (not shown) in the substrate 300 on both sides of the dummy gate 306 of the MOS transistor 340. Then, a wet etching process is performed to enlarge isotropically the first recess (not shown) to form the second trench 320, which has a depth comprised between 300 Å and 800 Å, preferably 400 Å. In one embodiment of the present invention, the wet etching is performed by using an etchant including sulfur hexafluoride ($SF_6$) or nitrogen trifluoride ($NF_3$). It is appreciated that, the method of forming the second recess 320 is not limited to the above-described steps, but can include other methods having one single etching step or multiple etching steps in combination with dry etching and/or wet etching. In addition, the mask layer 316 on the MOS transistor 340 and the STI 302 can be partially removed or completely removed thereafter, depending on the circumstances.

Figure 4:
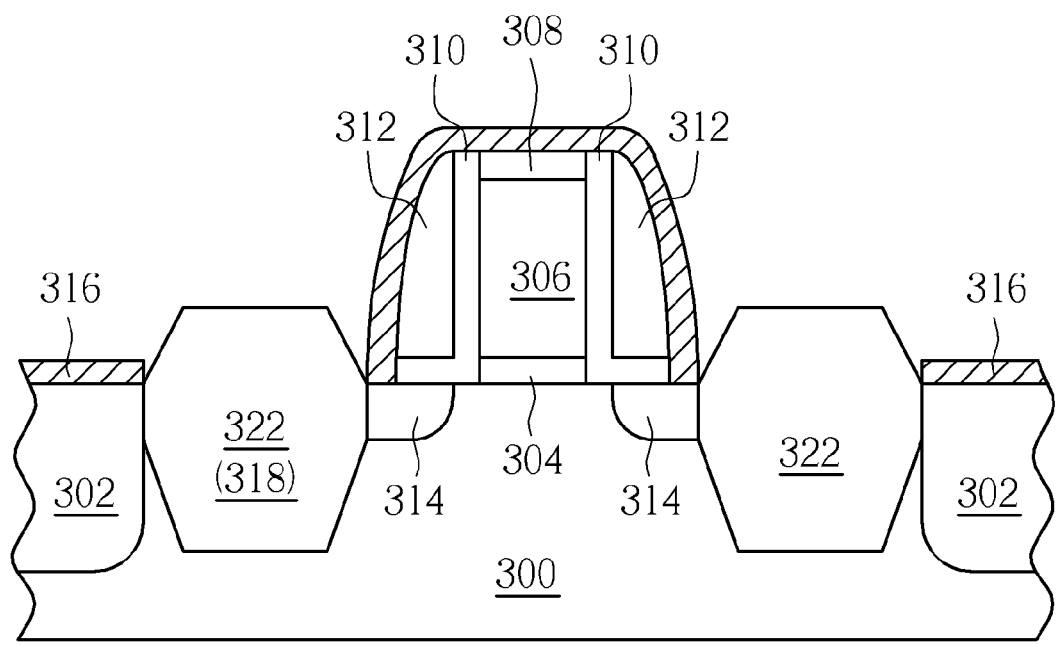

As shown in FIG. 4, a selective epitaxial growth (SEG) process is performed to form an epitaxial layer 322 in the second recess 320. In one preferred embodiment of the present invention, the epitaxial layer 322 has a part higher than the surface of the substrate 300 and another one below the surface of the substrate 300. Preferably, the epitaxial layer 322 includes a cross section having a shape of a hexagon (also called sigma Σ) or a shape of an octagon. In one embodiment, the material of the epitaxial layer 322 can be adjusted according to the type of the MOS transistor 340. For example, when the MOS transistor 340 is a PMOS, the epitaxial layer 322 may include SiGe, which can be doped in-situ with P type dopants to form a P+ SiGe epitaxial layer thereby. By doing so, the subsequent source/drain (S/D) ion implantation step for the PMOS and a corresponding P+ S/D photo mask can be spared. In another embodiment of the present invention, when the MOS transistor 340 is NMOS, the epitaxial layer 322 may include SiC, which can be doped in-situ with N type dopants to form an N+ SiC epitaxial layer thereby. In another embodiment, after forming the epitaxial layer 322, an implanting process can be carried out on the epitaxial layer 322 to form the source/drain region 318 of the MOS transistor 340.

Besides, the epitaxial layer 322 can be formed by a SEG process through a single or a multiple layer approach; the dopants can be gradually arranged, heterogeneous atoms (such as Germanium or Carbon atoms) can be altered in a gradual arrangement, with the surface of the epitaxial layer 322 having a preferably lighter concentration of, or no Germanium at all, to facilitate the subsequent formation of a metal silicide layer.

Figure 5:
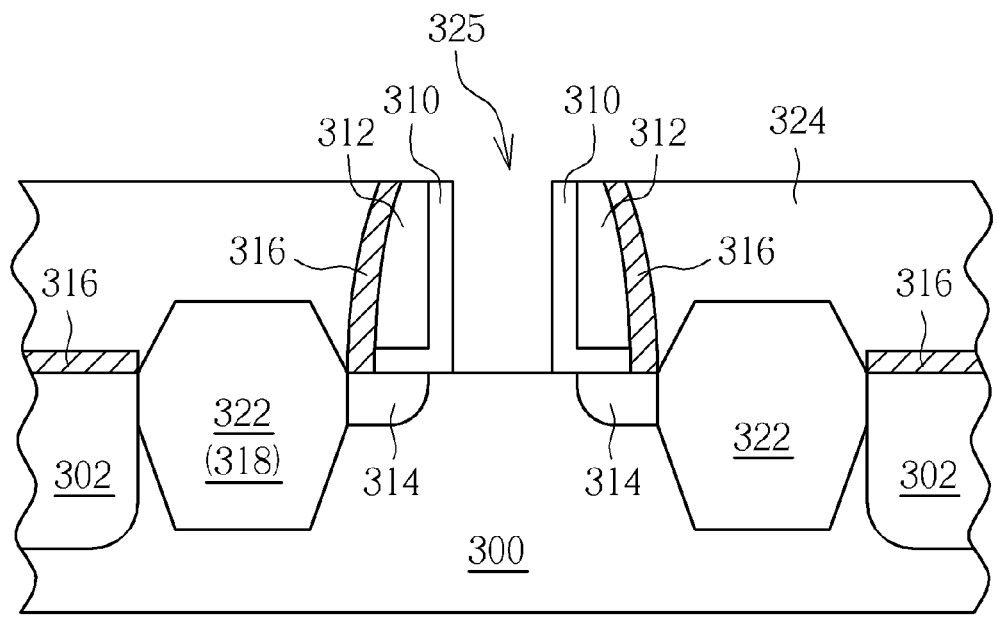

As shown in FIG. 5, a sacrificial layer 324 is formed on the substrate 300 to completely cover the STI 302 and the MOS transistor 340. The sacrificial layer 324 may include spin-on glass (SOG), bottom anti-reflective coating layer (BARC layer), photoresist layer, advanced pattern film (APF) or other suitable carbon containing materials or silicon containing materials. In one preferred embodiment, the material of the sacrificial layer 324 has an etching selectivity with respect to the mask layer 316. For example, when the mask layer 316 includes SiN, the sacrificial layer 324 can include SOG. Then, a planarization process is carried out, such as a chemical mechanical polish (CMP) process, or an etching back process or a combination of both, to sequentially remove apart of the sacrificial layer 324, a part of the mask layer 316, a part of the liner layer 310, a part of the spacer 312, and remove all of the cap layer 308 up to the exposure of the dummy gate 306. Subsequently, the dummy gate 306 and the interfacial layer 304 are removed by using a dry etching and/or a wet etching, thereby forming a recess 325 in the MOS transistor 340.

Figure 6:
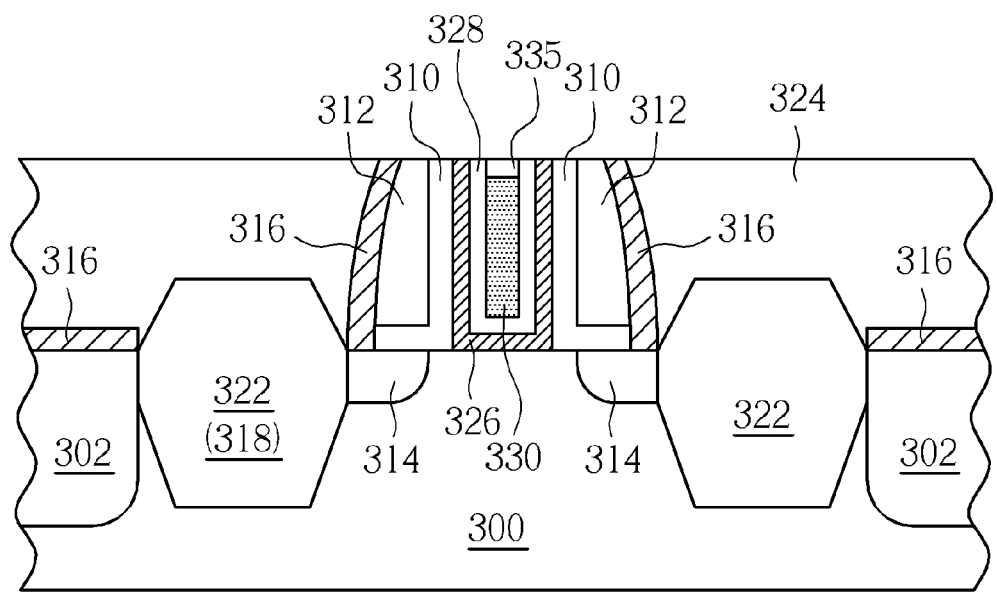

As shown in FIG. 6, a high-k dielectric layer 326, a work function metal layer 328 and a low resistance layer 330 are formed on the substrate 300 to, at least, fill the recess 325. A planarization process is carried out to remove the above layers that are outside the recess 325. In one embodiment, the high-k dielectric layer 326 includes rare earth metal oxide or lanthanide oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide (Ta2O5), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZrxTi_{1-x}O_3$, PZT) or barium strontium titanate ($BaxSr_{1-x}TiO_3$, BST), but is not limited thereto. The material of the work function metal layer 328 is adjusted according to the type of the MOS transistor 340. For example, when the MOS transistor 340 is PMOS, a work function metal layer 328 required by a P-type transistor includes Ni, Pd, Pt, Be, Ir, Te, Re, Ru, Rh, W, Mo, or WN, RuN, MoN, TiN, TaN, or WC, TaC, TiC, or TiAlN, TaAlN, but should not be limited thereto. When the MOS transistor 340 is NMOS, a work function metal layer 328 required by an N-type transistor includes TiAl, ZrAl, WAl, TaAl or HfAl, but should not be limited thereto. The low resistance layer 330 includes low resistance materials such as metals like Al, Ti, Ta, W, Nb, Mo, TiN, TiC, TaN, Ti/W or Ti/TiN, but not limited thereto. It is noteworthy that, in order to increase the electrical property of the MOS transistor 340, an assistant layer (not shown) can be selectively formed at an appropriate position. For example, a TiN layer can be selectively formed between the work function metal layer 328 and the low resistance layer 330, or between the high-k dielectric layer 326 and the work function metal layer 328. In another embodiment, the work function metal layer 328 or the high-k dielectric layer 326 can be subject of an appropriate treatment. For example, the high-k dielectric layer 326 can be submitted to an annealing process between 600° C. and 800° C. In this situation, since no silicide layer has been formed on the substrate 300 yet, the silicide layer would not be damaged by the annealing process. In one preferred embodiment of the present invention, after forming the low resistance layer 330, a protective layer 335 can be formed on the surface of the low resistance layer 330 by performing an oxygen treatment. For instance, when the low resistance layer 330 includes Al, the protective layer 335 may include Al2O3.

Figure 7:
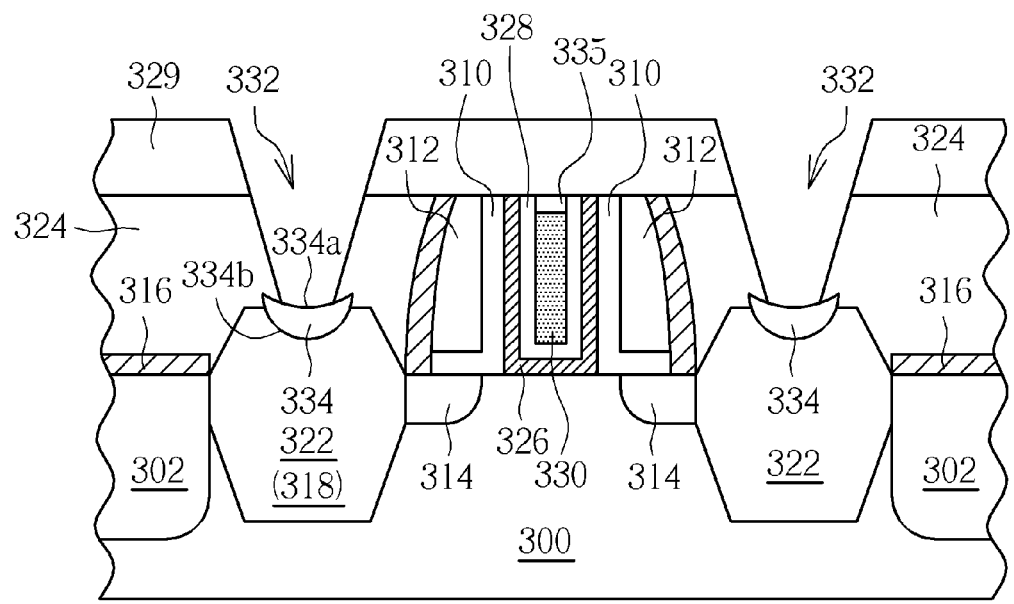

As shown in FIG. 7, a dielectric layer 329 is formed on the sacrificial layer 324 and the dielectric layer 329 may include same material as the sacrificial layer 324 such as SOG or other suitable materials. Subsequently, at least one contact hole 332 is formed in the sacrificial layer 324 and in the dielectric layer 329 to expose a part of the epitaxial layer 322. In one preferred embodiment, the contact hole 332 includes a tapered sidewall. Besides, depending on the material of the sacrificial layer 324, the composition of the etchant could be adjusted. For example, when the sacrificial layer 324 includes SOG, the etchant may include fluorine (F); when the sacrificial layer 324 includes BARC, the etchant may include oxygen (O); when the sacrificial layer 324 includes APF, the etchant may include hydrogen (H) and oxygen (O).

A silicide layer 334 is then formed on the epitaxial layer 322 exposed by the contact hole 332. The silicide layer 334 may include NiSi, CoSi or TiSi. The method of forming the silicide layer 334 may include, for example, a first step of cleaning; then, a physical vapor deposition (PVD) process is performed to form a metal layer at least on the exposed epitaxial layer 322, and then an annealing process is performed to have the metal layer reacted with the epitaxial layer 322 to form the silicide layer 334. Finally, un-reacted metal is removed. Since the scale of the contact hole 332 is comprised between 28 nm and 20 nm, when performing the cleaning step, the tapered sidewall of the contact hole 332 are likely to have residual impurities. Therefore, when forming the metal layer on the epitaxial layer 322, the metal layer is not easy to form near the sidewalls of the contact hole 332, resulting in the subsequently formed silicide layer 334 having a "middle-thick" and "peripheral-thin" structure. That is, the thickness of the silicide layer 334 in the middle is greater than that in the peripheral. Besides, the silicide layer 334 further includes a curved top surface 334a and a curved bottom surface 334b, which are bending toward the substrate 300, leading to a "smile structure".

Figure 8:
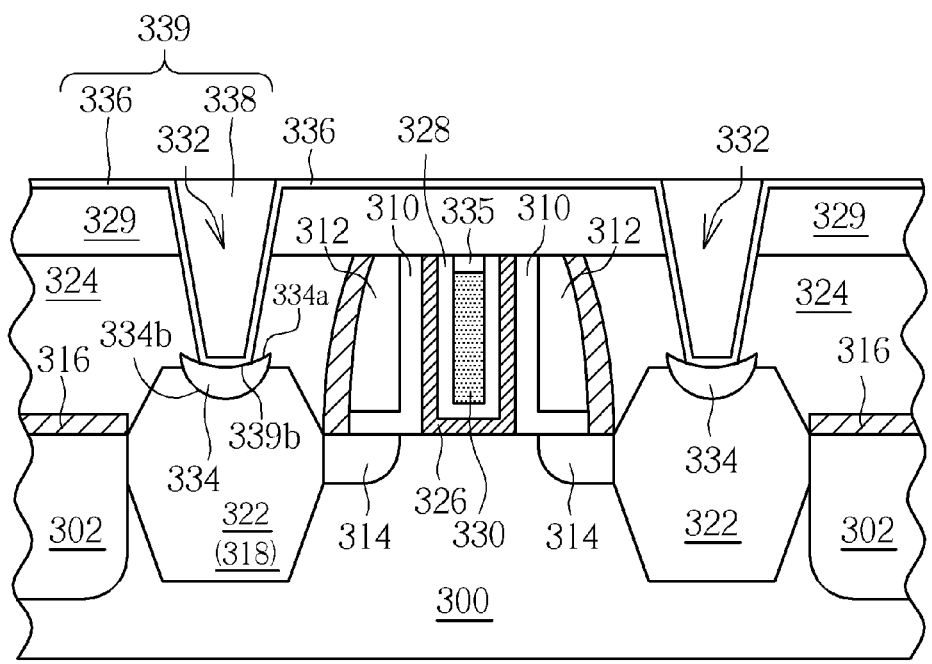

As shown in FIG. 8, a contact plug 339 is formed in the contact hole 332. The contact plug 339 may include, for example, a barrier layer 336 such as a TiN layer and a contact metal layer 338 such as a low resistance metal layer. The barrier layer 336 has direct contact with the surface of the silicide layer 334. Due to the curved top surface 334a of the silicide layer 334, a bottom surface 339b of the contact plug 339 is completely covered by the top surface 334a of the silicide 334, and an area of the top surface 334a of the silicide layer 334 is substantially greater than that of the top surface 339b of the contact plug 339. In this situation, the contact area between the contact plug 339 and the silicide layer 334 can be enlarged and the resistance therebetween can be reduced, thereby enhancing the performance of the MOS transistor 340. After forming the contact plug 339, another metal interconnection system can be formed thereon; and the manufacturing method is well known in the arts and is not described hereafter.

Figure 9:
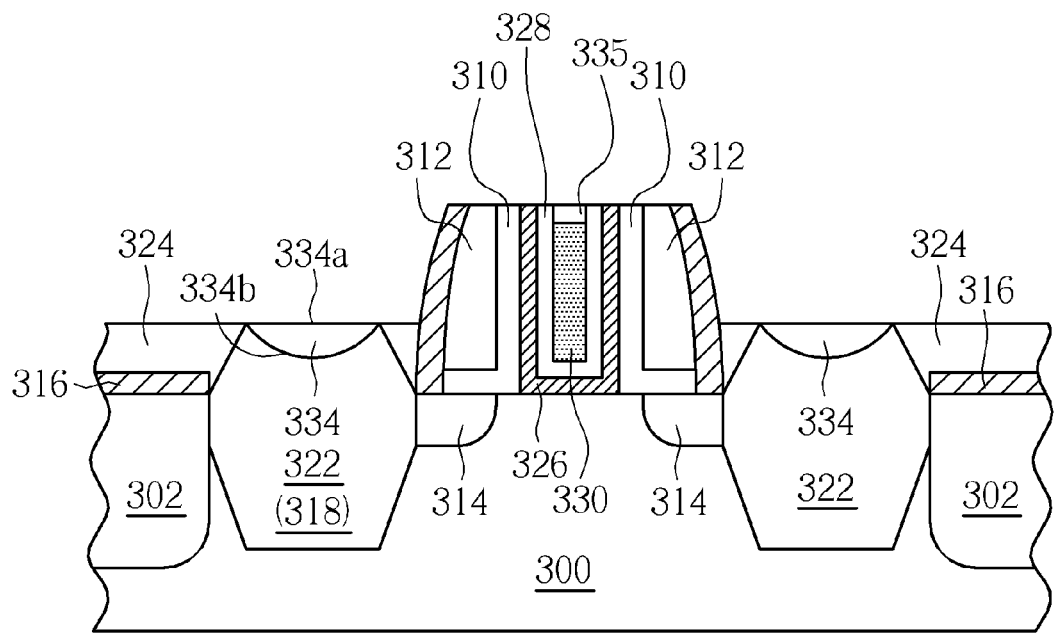
FIG. 9 and FIG. 10 illustrate a method of manufacturing a MOS transistor in accordance with the second embodiment of the present invention.
Figure 10:
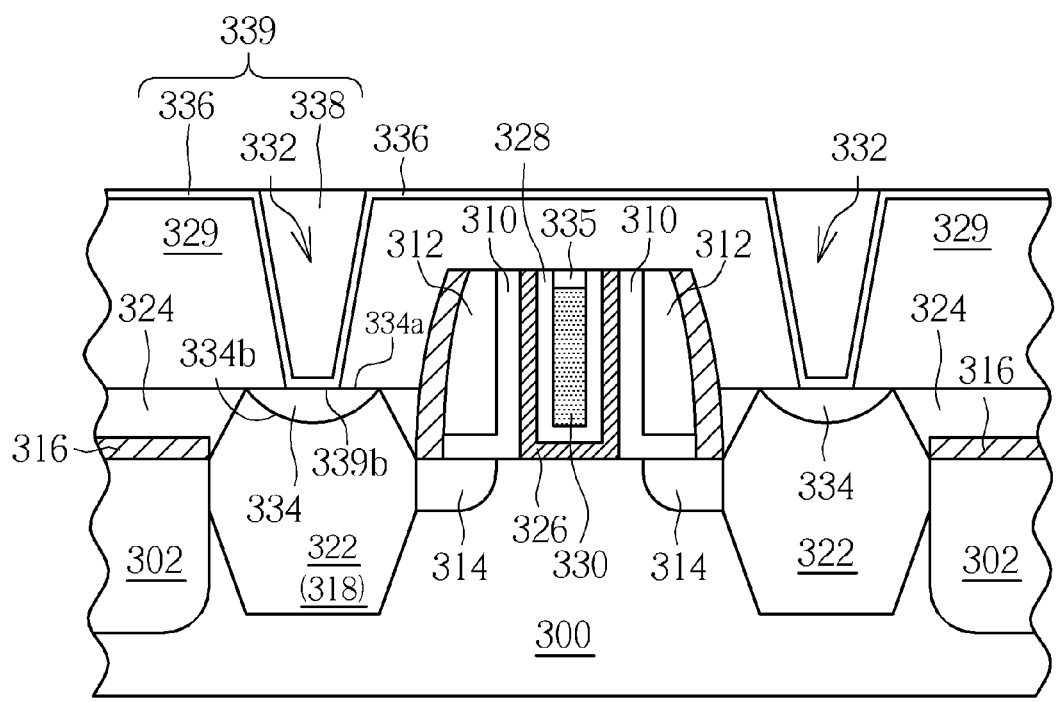

Please refer to FIG. 9 and FIG. 10, illustrate a method of manufacturing the MOS transistor in accordance with the second embodiment of the present invention. The formal steps in the second embodiment are similar to those as in FIG. 1 to FIG. 6 in the first embodiment and are not repeatedly described. After forming the structure in FIG. 6, please refer to FIG. 9, where the sacrificial layer 324 is removed from the substrate 300 to expose the epitaxial layer 322. In one embodiment, the sacrificial layer 324 can be partially removed, by performing an etching back process for example; to have the sacrificial layer 324 on the same level with the epitaxial layer 322, and expose the top surface of the epitaxial layer 322. In another embodiment, the sacrificial layer 324 can be removed completely. Besides, since it is covered by the mask layer 316 and the protective layer 335, which have etching selectivity with respect to the sacrificial layer 324, the MOS transistor 340 will not be damaged when forming the silicide layer 334. Then, the silicide layer 334 is formed on the epitaxial layer 322 and the forming steps thereof are similar to those in the first embodiment. In the present embodiment, the silicide layer 334 contains the curved bottom surface 334b as well. As shown in FIG. 10, a dielectric layer 329 is formed on the substrate 300 and, at least, one contact hole 332 is formed therein. A contact plug 339 containing a barrier 336 and a contact metal layer 338 is formed within the dielectric layer 329. The forming steps are similar to those in the first embodiment and are not described again here. In one embodiment, another metal interconnection system can be formed thereon in the subsequent steps.

It can be noted that in the above-mentioned embodiment, the silicide layer 334 is formed in the epitaxial layer 322, however, in another embodiment, the silicide layer 334 with smile structure can be formed in a conventional source/drain region. Besides, the above-mentioned embodiment describes a MOS transistor with a smile structure by means of a "gate-last" process and a "high-k last" process. In another embodiment, it is understood that the MOS transistor 340 in the present invention can also be fabricated by means of a "gate-first" process or a "high-k first" process. In another embodiment, the MOS transistor 340 can be applied to non-planar transistor applications such as Fin-FET and is not limited to the planar transistor application shown above.

In summary, the present invention provides a MOS transistor and the manufacturing method thereof. The MOS transistor includes a silicide layer with a smile structure, having a curved top surface and a curved bottom surface so that the resistance between the contact plug and the silicide layer can be reduced. Besides, the MOS transistor in the present invention is formed in a narrow space, such as a plug hole, so the smile structure can be formed. In addition, the silicide layer is formed after the high-k dielectric layer so that the annealing process of the high-k dielectric does not affect the silicide layer, which can therefore have higher quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A manufacturing method of a MOS transistor, comprising:
providing a substrate; wherein a transistor is disposed in the substrate, the transistor comprises a gate dielectric layer, a gate on the gate dielectric layer and a source/drain region in the substrate at two sides of the gate, wherein the source/drain region is higher than a top surface of the substrate;

forming a sacrificial layer on the substrate to cover the transistor;

removing a part of the sacrificial layer to form a contact hole in the sacrificial layer to expose the source/drain region, wherein the contact hole continuously shrunk from top to bottom thereof; and forming a silicide layer through the contact hole on the exposed source/drain region, wherein an entire portion of the silicide layer is higher than the top surface of the substrate and comprises a curved bottom surface, and two ends of the silicide layer point tips raised up over the source/drain region, wherein a bottom surface of the contact hole is higher than a top surface of the source/drain region after forming the silicide layer.

2. The manufacturing method of a MOS transistor as in claim 1, wherein when forming the silicide layer, the sacrificial layer levels with the gate.

3. The manufacturing method of a MOS transistor as in claim 1, wherein when forming the silicide layer, the sacrificial layer levels with the source/drain region.

4. The manufacturing method of a MOS transistor as in claim 1, wherein when forming the silicide layer, there is no sacrificial layer on the substrate.

5. The manufacturing method of a MOS transistor as in claim 1, further comprising forming a dielectric layer on the sacrificial layer and the contact hole is formed in the sacrificial layer and the dielectric layer, wherein the dielectric layer is disposed on the sacrificial layer.

6. The manufacturing method of a MOS transistor as in claim 1, wherein the sacrificial layer comprises SOG, BARC, APF or photoresist.

7. The manufacturing method of a MOS transistor as in claim 1, wherein the step of forming the source/drain region comprises forming an epitaxial layer.

8. The manufacturing method of a MOS transistor as in claim 1, wherein the step of forming the silicide layer comprises:
performing a cleaning step;
forming a metal layer to at least cover the source/drain region;
performing an annealing process to make the metal layer react with the source/drain region; and
removing the metal layer not reacted with the source/drain region.

9. The manufacturing method of a MOS transistor as in claim 1, wherein the step of forming the transistor comprises:
forming a dummy gate on the substrate;
removing the dummy gate;
forming a high-k dielectric layer on the substrate;
performing an annealing process toward the high-k dielectric layer;
forming a low resistance layer on the high-k dielectric layer; and
forming a protective layer on the surface of the low resistance layer.

10. The manufacturing method of a MOS transistor as in claim 1, wherein an entirety of the contact hole is between 20 nm to 28 nm.

11. The manufacturing method of a MOS transistor as in claim 1, wherein the silicide layer is thicker in the middle than two ends thereof.

12. The manufacturing method of a MOS transistor as in claim 1, wherein a top surface of the silicide layer is lower than a top surface of the sacrificial layer.

13. The manufacturing method of a MOS transistor as in claim 1, wherein a bottom surface of the contact hole is higher than the top surface of the substrate.

* * * * *